US008829939B2

(12) United States Patent
Ponghon et al.

(10) Patent No.: US 8,829,939 B2
(45) Date of Patent: Sep. 9, 2014

(54) SHUTTLE PLATE HAVING POCKETS FOR ACCOMODATING MULTIPLE SEMICONDUCTOR PACKAGE SIZES

(75) Inventors: Mhark Lester Lauron Ponghon, Baguio (PH); Jose Karlo Garzon Tafalla, Baguio (PH); Rossbert Galvez Arguelles, Baguio (PH); Archie Gil Flores Quevedo, Caloocan (PH); Christian Malunes Quidato, Baguio (PH); Allen Harvey Salazar Bata-Anon, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 445 days.

(21) Appl. No.: 13/153,005

(22) Filed: Jun. 3, 2011

(65) Prior Publication Data
US 2012/0306526 A1 Dec. 6, 2012

(51) Int. Cl.
*G01R 31/26* (2014.01)
*H01L 21/673* (2006.01)
*G01R 31/28* (2006.01)
*G01R 1/04* (2006.01)

(52) U.S. Cl.
CPC ...... *G01R 31/2893* (2013.01); *H01L 21/67333* (2013.01); *G01R 1/04* (2013.01)
USPC .................................................. 324/762.01

(58) Field of Classification Search
None
See application file for complete search history.

(56) References Cited

U.S. PATENT DOCUMENTS

| 4,506,213 A | 3/1985 | O'Connor |
| 5,227,717 A * | 7/1993 | Tsurishima et al. ..... 324/754.11 |
| 6,346,682 B2 * | 2/2002 | Kim et al. ..................... 209/573 |
| 2004/0134054 A1 | 7/2004 | Sum et al. |

FOREIGN PATENT DOCUMENTS

| JP | 08179007 A | 7/1996 |
| KR | 1020060003893 A | 1/2006 |
| KR | 1020060062244 A | 6/2006 |

OTHER PUBLICATIONS

PCT Search Report; International Application No. PCT/US2012/040722 dated Dec. 3, 2012.

* cited by examiner

*Primary Examiner* — Vinh Nguyen
(74) *Attorney, Agent, or Firm* — Steven A. Shaw; Frederick J. Telecky, Jr.

(57) ABSTRACT

An input/output shuttle plate includes a metal plate having a plurality of pockets. The plurality of pockets have a bottom, a sidewall portion and a pocket depth. A first seating surface at a first pocket depth ($d_3$) is for supporting a first packaged semiconductor device having a first package size, and at least a second seating surface at a second pocket depth ($d_4$) is for supporting a second packaged semiconductor device having a second package size. The first pocket depth is less than the second pocket depth ($d_3 < d_4$), and the first package size is larger than the second package size. The shuttle plate is adapted to be fit on a test handler, such as by shuttle plate clips.

25 Claims, 7 Drawing Sheets

SHUTTLE PLATE HAVING POCKETS FOR ACCOMODATING MULTIPLE SEMICONDUCTOR PACKAGE SIZES

FIELD

Disclosed embodiments relate to test handlers for transporting packaged semiconductor devices from an input area into position for electronic testing in a test site area by automatic electronic test equipment, and to an output area for binning after testing.

BACKGROUND

Pick and place (PnP) handlers are widely used in surface mount technology for moving packaged semiconductor devices during assembly and test. Gravity handlers are also used.

Handlers for electronic test equipment transport devices from an input area where there are typically operator loaded units for test to the test site area that includes contactors where the electrical testing takes place. Electronic testing of packaged semiconductor devices on a test floor generally involves handler conversion activities between test lots when different package sizes, pin types and package thicknesses are presented for test. A conversion kit (or changeover kit) including package specific hardware along with some parametric changes are used for this conversion, along with a contactor that contacts the packages devices during electrical testing.

Hardware for PnP handlers in a conversion kit includes left/right metal shuttle plates having indentations referred to as pockets, input/output (IO) PnP suction cups that fit into the pockets, and test site (TS) PnP nests (or Chucks Nests). The left TS PnP picks up the packaged device from left shuttle plate prior to test, holds the packaged device and ensures proper contact and alignment during test, and returns the tested packaged device to the left shuttle after test. The right TS PnP nest, on the other side, performs the same function of picking up packaged devices from right shuttle place prior to test, holding them and ensuring proper contact and alignment during testing, and returning the tested packaged device to the right shuttle after test. The IO PnP picks up all tested units from left and right shuttle and then sorts them into binning trays in the output area.

Long conversion downtime between test setups is experienced when performing conventional handler package-to-package conversions particularly for PnP handlers due to the need to change the conversion kit components including the input IO PnP suction cups, the left/right shuttle plates and the test site (TS) PnP nests, and to perform re-alignment. Such conventional conversions generally take about 3 hours to perform. PnP conversion kit replacement and hardware changes alone covers about 2 hours of the conversion time, including time for re-alignment of about at least 1 hour including determination of new offset of handler encoder values, IO PnP centering alignment against the shuttle, Shuttle plate alignment against IO PnP, TS PnP centering alignment against the shuttle, and shuttle plate hardstop against a reference point that is necessitated by replacement of the shuttle plates.

SUMMARY

Disclosed embodiments recognize that for conventional test handlers, every different sized packaged device must have its own shuttle plate, and the test sites and input/output (IO) transfer mechanisms base their alignment during package-to-package conversions on the particular shuttle plate. Therefore, whenever the shuttle plate is replaced during such conversions, re-alignment of the test site (TS) pick and place (PnP) and IO PnP with respect to the shuttle plate is needed. Disclosed "multi-package" shuttle plates save conversion time by being configured to seat a plurality of different package sizes so that the shuttle plate can be retained through package conversions, and the need for re-alignment due to conversion can thus be avoided.

Disclosed shuttle hardware changes are sped by multi-package IO shuttle plates adapted to be fit on a test handler, that have pockets each with a plurality of seating surfaces at different pocket depths for supporting a plurality of different packaged semiconductor device sizes. In one embodiment the respective seating surfaces comprise notches at different elevations formed in the sidewall portion of the pockets.

Disclosed pockets thus seat a plurality of different package sizes all with the same center position. A sloped sidewall can realize a funnel type (widest top with inward sloping sides) pocket design that allows the package semiconductor devices to settle inside the pocket and self align upon insertion into the pocket.

DETAILED DESCRIPTION

Figure 1:
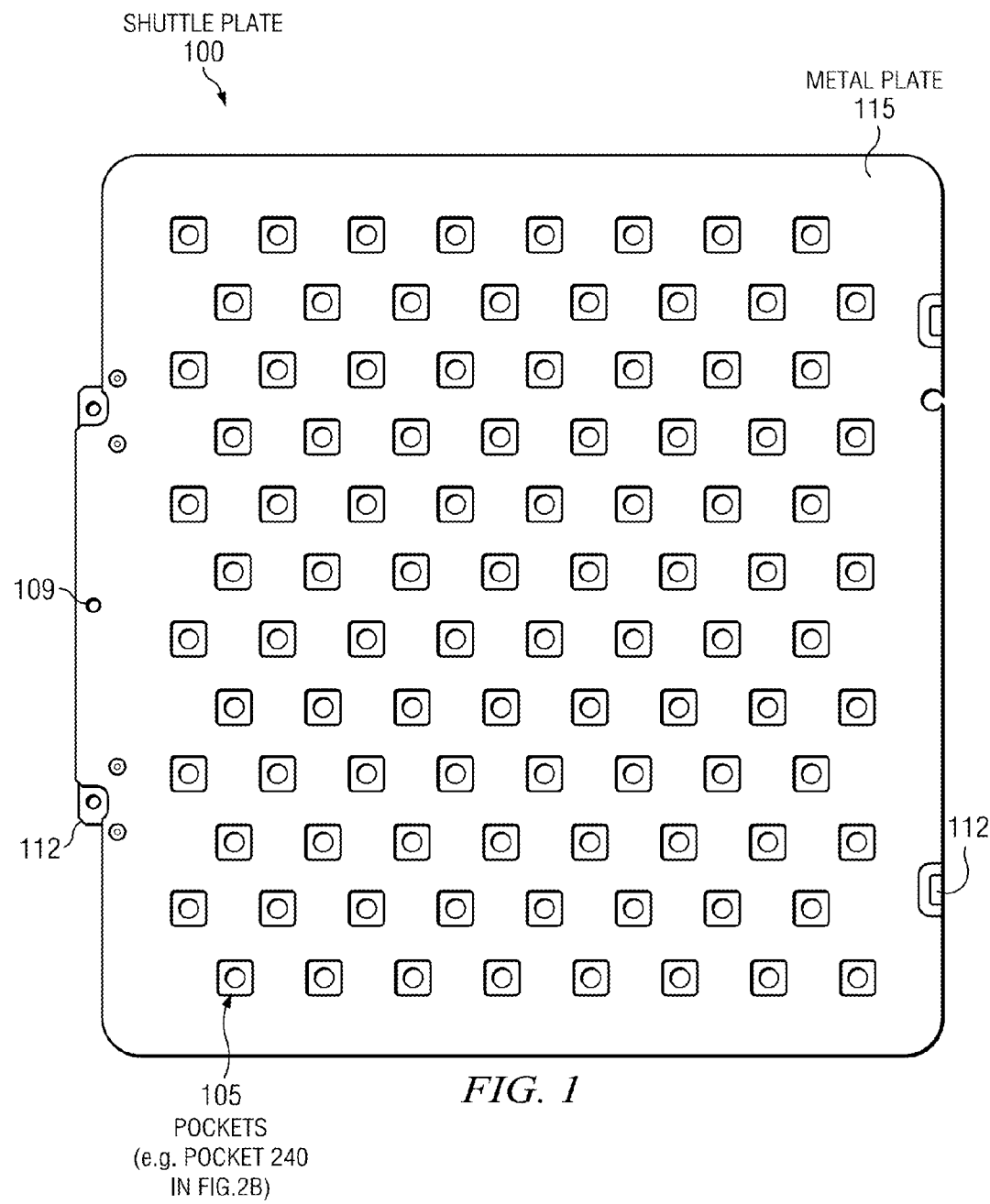
FIG. 1 is perspective top view of a disclosed multi-package shuttle plate including a 2-dimensional (2-D) array of pockets that each include a plurality of seating surfaces at different pocket depths for seating a plurality of different packaged semiconductor devices that have different package sizes, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is perspective top view of a disclosed multi-package shuttle plate 100 adapted to be fit on a test handler comprising a metal plate 115 including a 2-D array of pockets 105 that each include a plurality of seating surfaces at different pocket depths for seating a plurality of different packaged semiconductor devices that have different package sizes, according to an example embodiment. Disclosed multi-package shuttle plates can be utilized for PnP handlers. Details regarding seating surfaces for disclosed pockets 105 can be seen in FIGS. 2A-C which show example cross sectional depictions of pockets that reveal example seating surface designs in the sidewalls of the pockets, where in one particular embodiment the pockets 105 for shuttle plate 100 can comprises the example pocket 240 shown in FIG. 2B that as described below has a notched seating surface design.

Having pockets with a pocket depth during pick of untested packaged devices that is shallower as compared to a pocket depth of pockets used for drop of tested packaged devices helps allow the suction cups to engage enough on the packaged device surface to be able to reliably pick the packaged devices. A deeper pocket depth for pockets on the shuttle plate used for shuttle drop of tested devices allows sufficient clearance to disengage the packaged device against the suction cups holding it.

In one embodiment all the pockets on the shuttle plate 100 are generally designed to be identical so that the plurality of pockets provided share the same pocket depth and pocket design for seating both the respective packaged semiconductor devices having different sizes. In this embodiment there can be a dedicated input shuttle plate and a dedicated output shuttle plate, where the pocket depth for pockets on the input shuttle place for picking untested packaged devices can be reduced as compared to the pocket depth of pockets on the output shuttle plate for dropping tested packaged devices.

In another embodiment, some pockets on the shuttle plate are substantially deeper as compared to other pockets on the same shuttle plate, so that a given shuttle plate can function as both as input shuttle for untested packaged devices and an output shuttle for tested packaged devices. In this embodiment a portion of the plurality of pockets on the shuttle plate provide a first pocket depth for supporting first packaged devices and a second pocket depth for supporting second packaged devices, and another portion of the plurality of pockets on the same shuttle plate are deeper pockets that provide a deepened first pocket depth that is substantially deeper as compared to the first pocket depth for supporting the first packaged devices and a deepened second pocket depth that is substantially deeper as compared to the second pocket depth for supporting the second packaged devices.

As used herein, "substantially deeper" refers to a depth difference of at least 0.2 mm for the respective pocket depths. In this arrangement, the shuttle plate can function as both as input shuttle for untested packaged devices and an output shuttle for tested packaged devices. An advantage of this arrangement is an increased throughput as the left TS PnP can work with the left shuttle while the right TS PnP inserts packaged devices for electrical testing.

As described below, disclosed pockets seat the respective package sizes at different elevations (vertically) in the pocket. As a result, the respective seating positions are concentric with one another.

Packaged semiconductor devices that can be transported by disclosed multi-package shuttle plates include conventional leaded packages, leadless packaged devices, as well as wafer chip scale packages (WCSP). A pair (first and second) of disclosed multi-package shuttle plates can be used for a test handler for electronic testing equipment to electrically test packaged semiconductor devices.

As used herein a test "handler" includes any apparatus that physically places one or more packaged electronic devices in position for automatic testing by electronic testing equipment to which the test handler is interfaced. The interface between the electronic testing equipment and any packaged electronic devices in position for testing is through one or more contactors. A contactor is a device that has electrical leads that close and open upon the leads of the device under test. During the time the leads are closed, the electronic test equipment is usually performing a variety of electrical tests.

Shuttle plate 100 includes center alignment tool holes 109 for aligning a TS PnP nest against it, and the shuttle plate clips 112 shown allow the shuttle plate 100 to be securely attached to a test handler. The shuttle plate 100 is generally made from a metal or metal alloy, such as the aluminum alloy ALU 6061 is one embodiment.

Figure 2A:
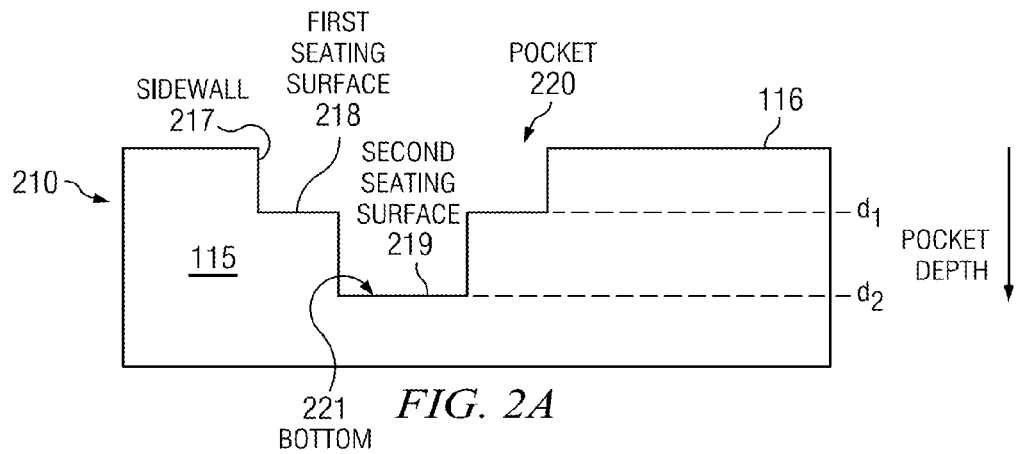
FIGS. 2A-C are cross sectional depictions of shuttle plate portions including example pockets having a plurality of seating surfaces for seating a plurality of different packaged semiconductor device that have different package sizes, according to an example embodiment.
Figure 2B:
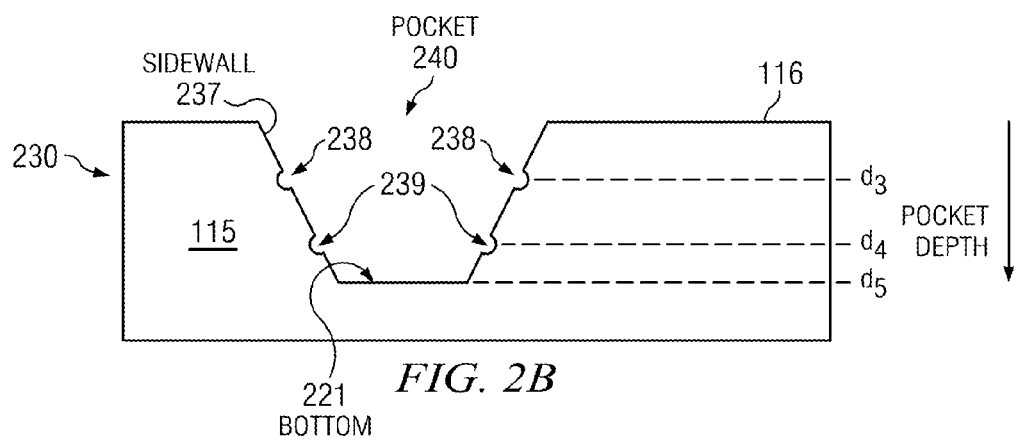
Figure 2C:
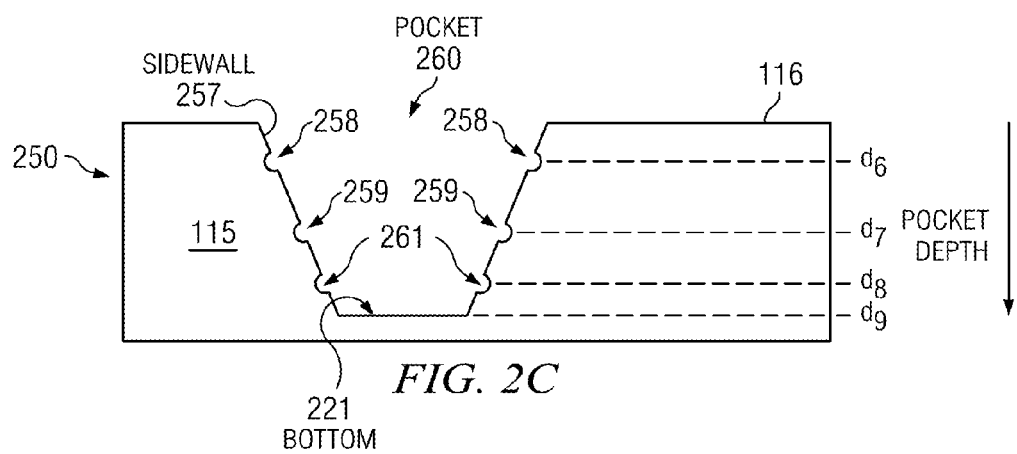

FIGS. 2A-C are cross sectional depictions of shuttle plate portions that include an example pocket having a plurality of seating surfaces at different pocket depths for seating a plurality of different sized packaged semiconductor devices, according to an example embodiment. The plate portion 210 shown in FIG. 2A includes pocket 220 having a bottom 221, and a sidewall portion 217 that is shown as a vertical sidewall. Pocket 220 also includes a first seating surface 218 at a pocket depth shown as $d_1$ and a bottom 221 at a pocket depth $d_2$ which provides a second seating surface 219, where the pocket depths are measured from the top surface 116 of metal plate 115 towards the bottom 221.

The first seating surface 218 is for seating a first packaged semiconductor device having a first package size, and the second seating surface 219 is for seating a second packaged semiconductor device having a second package size. The first pocket depth $d_1$ is less than the second pocket depth $d_2$, so that the first package size larger than the second package size.

FIGS. 2B and 2C show embodiments where the seating surfaces comprise notches (or shoulders) in the sidewall portion of the pockets at different pocket depths. Disclosed notches can be formed through machine shop fabrication using a cutting tool, or other suitable method. The plate portion 230 shown in FIG. 2B includes a pocket 240 that includes a sloped sidewall 237 that extends between the top surface 116 of the metal plate 115 to a depth $d_5$. Pocket 240 includes a first notch 238 at a first pocket depth $d_3$ for supporting a first packaged semiconductor device having a first package size, and a second notch 239 at a second pocket depth $d_4$ for supporting a second packaged semiconductor device having a second package size. The first pocket depth $d_3$ is less than the second pocket depth $d_4$, so that the first package size is larger than the second package size.

The plate portion 250 shown in FIG. 2C includes a pocket 260 that includes a sloped sidewall 257 that extends between the top surface 116 of the metal plate 115 to a depth $d_9$. Pocket 240 includes a first notch 258 at a first pocket depth $d_6$ for supporting a first packaged semiconductor device having a first package size, and a second notch 259 at a second pocket depth $d_7$ for supporting a second packaged semiconductor device having a second package size, and a third notch 261 at a third pocket depth $d_8$ for supporting a third packaged semiconductor device having a third package size. The first pocket depth $d_6$ is less than the second pocket depth $d_7$, which is less than the third pocket depth $d_8$, so that the first package size larger than the second package size which larger than the third package size. In one particular embodiment the first package size is x by x mms, the second package size is x–1 by x–1 mms, and the third package size is x–2 by x–2 mms (e.g., 12×12 mm, 11×11 mm and 10×10 mm).

Figure 3:
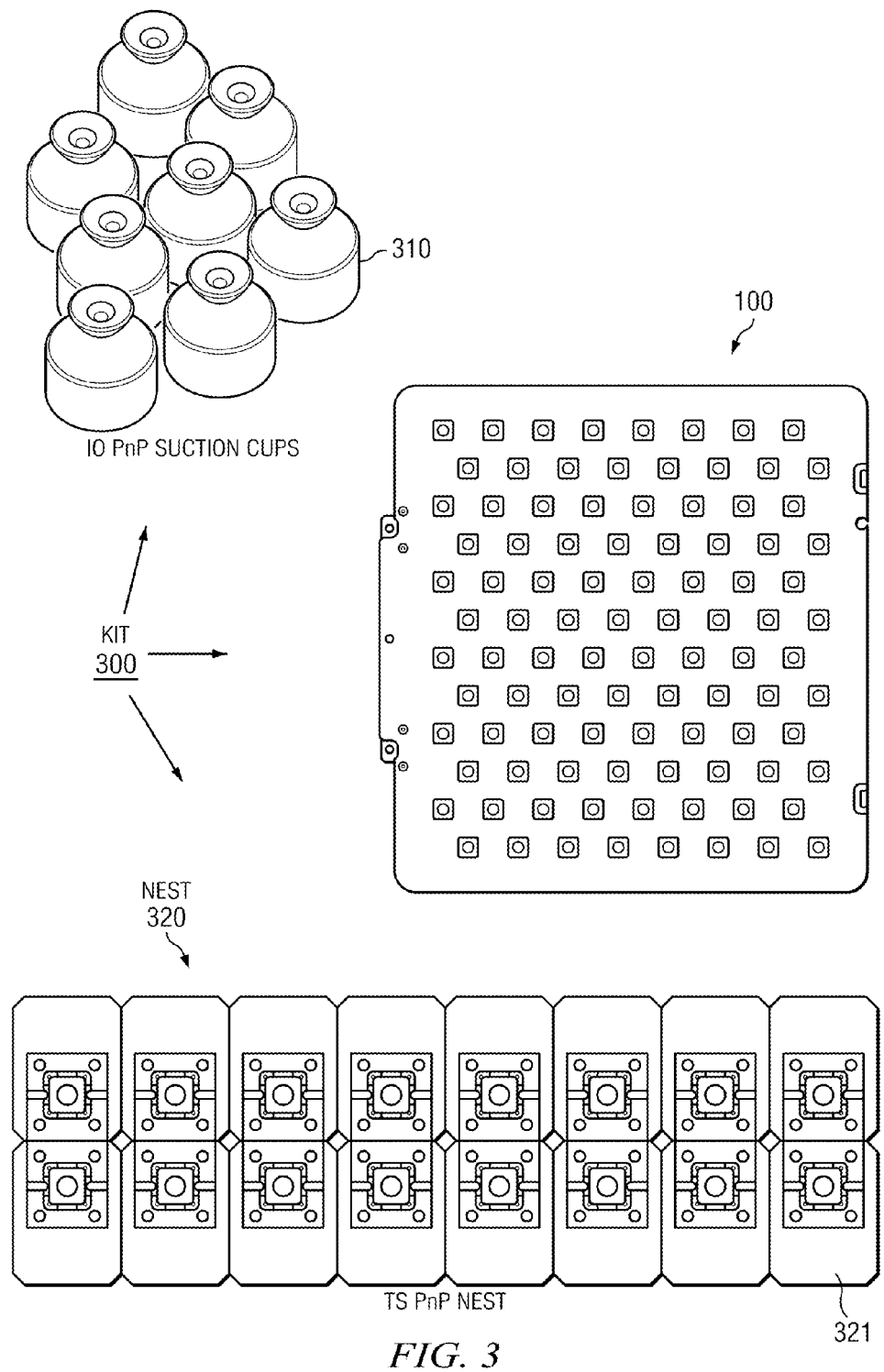
FIG. 3 is a depiction of example handler conversion kit hardware comprising IO PnP suction cups, a disclosed shuttle plate in which two are included, and a multi-piece TS PnP nest, according to an example embodiment.

FIG. 3 is a depiction of handler conversion kit hardware 300 comprising IO PnP suction cups 310, a left/right shuttle plate 100 in which two are included (only one shown), and a 16 piece TS PnP nest 320 comprising PnP test pieces 321. As noted above, IO PnP suction cups 310 are attached on a IO PnP head that is responsible in picking packaged devices either for test or sorting after test. Due to the multi-package size capabilities of disclosed shuttle plates such as shuttle plate 100, some package-to-package handler conversion kits do not include changing the shuttle plates 100, and only change the IO PnP suction cups 310 and TS PnP nest 320 while retaining shuttle plates 100 for package-to-package conversions.

Figure 4A:
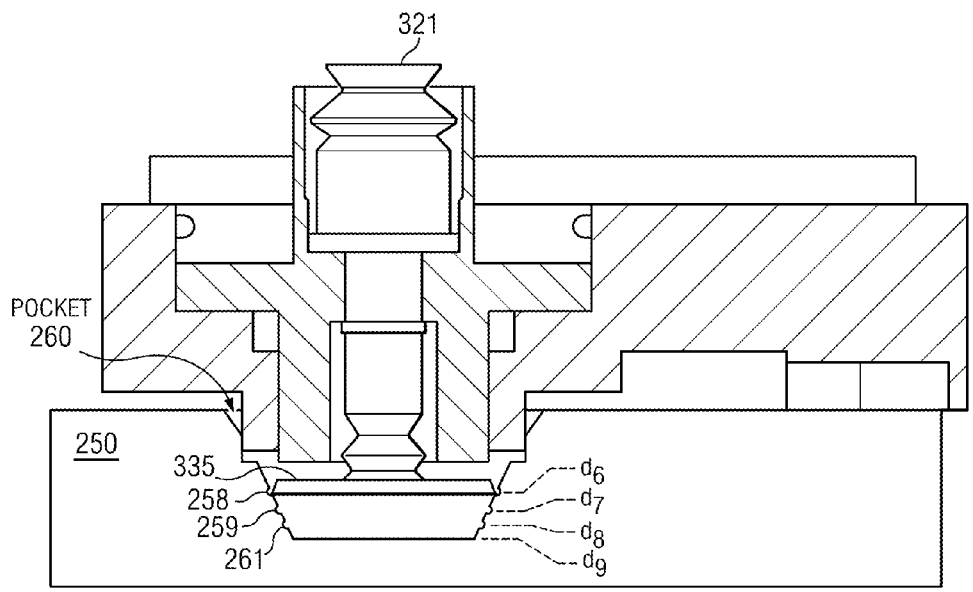
FIGS. 4A-F depict operation of a disclosed pocket of a disclosed multi-package shuttle plate interfacing with a TS PnP nest pieces for three different packaged semiconductor devices that have different package sizes, in FIGS. 4A-C at shuttle pick up for the respective packaged semiconductor devices and in FIGS. 4D-F at shuttle drop after test for the respective packaged semiconductor devices, according to an example embodiment.
Figure 4B:
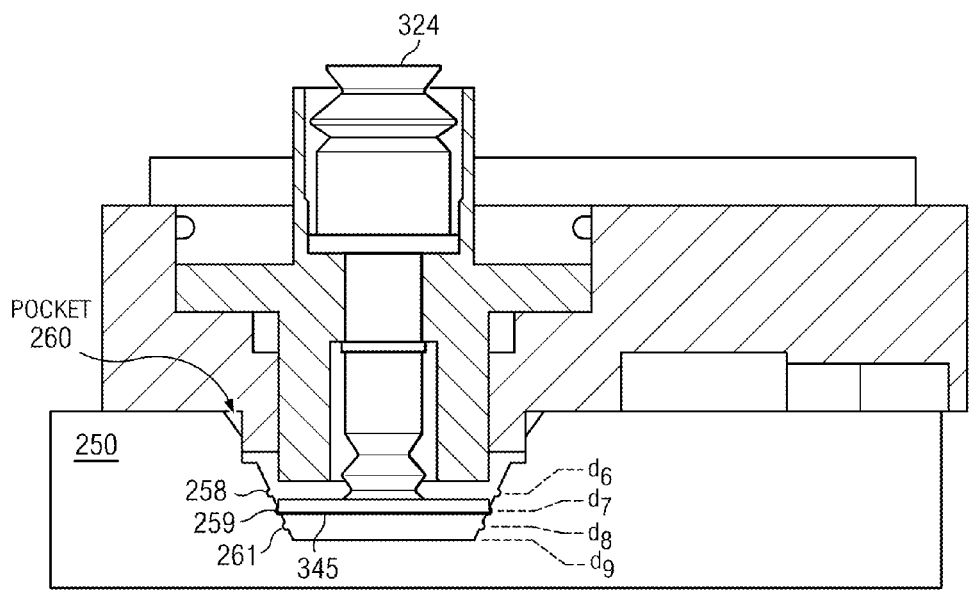
Figure 4C:
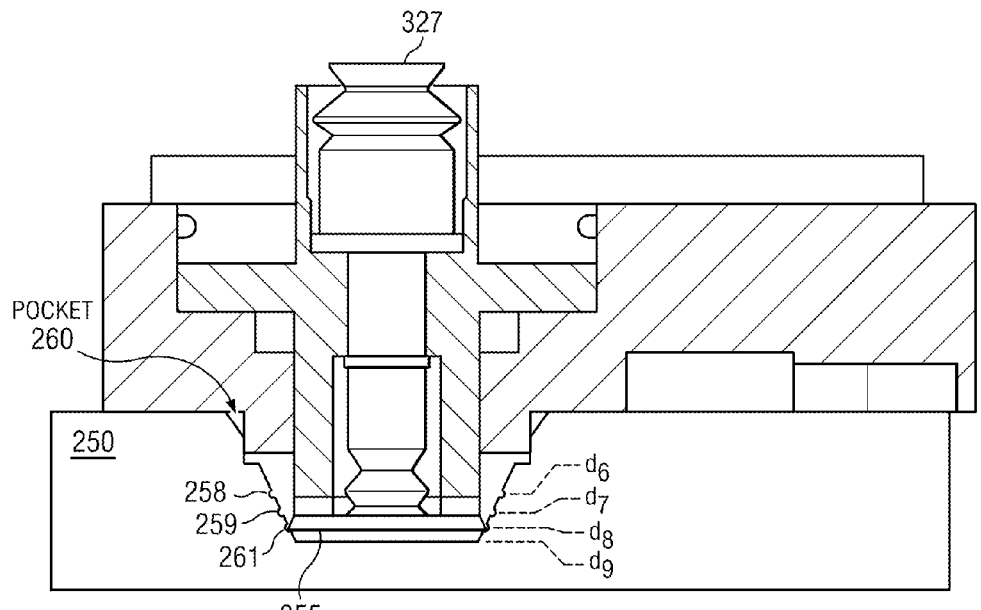
Figure 4D:
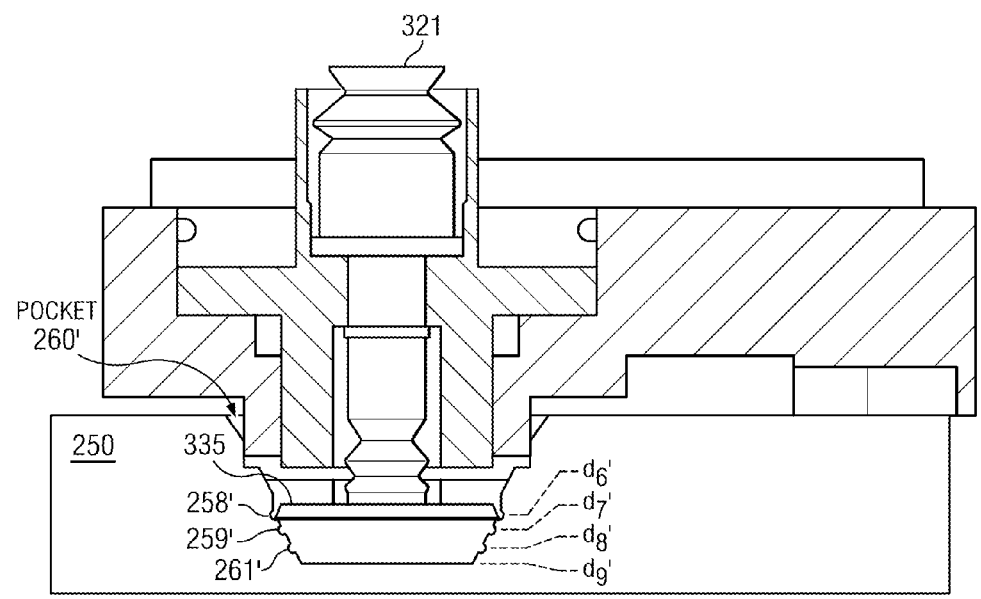
Figure 4E:
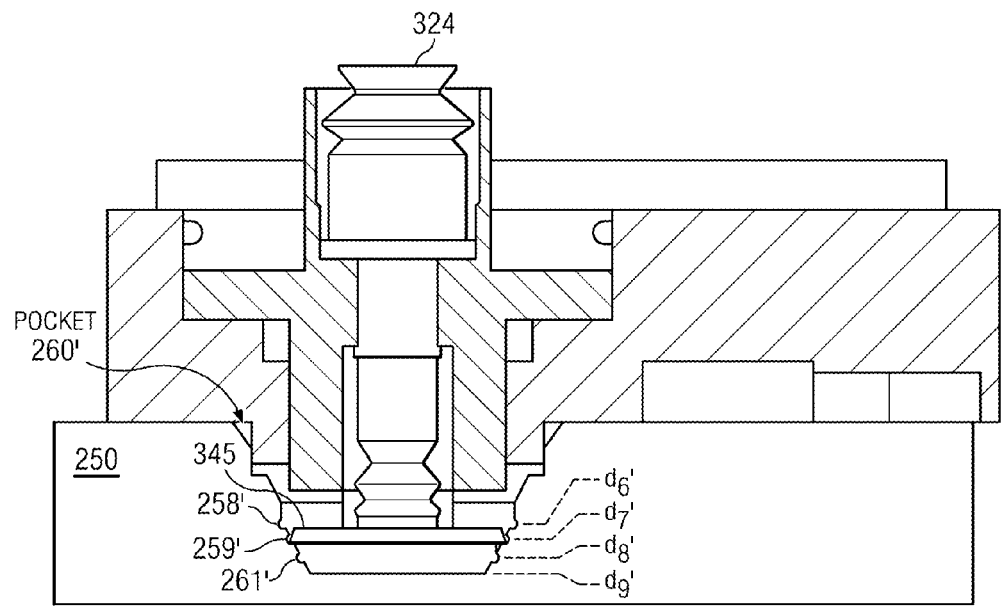
Figure 4F:
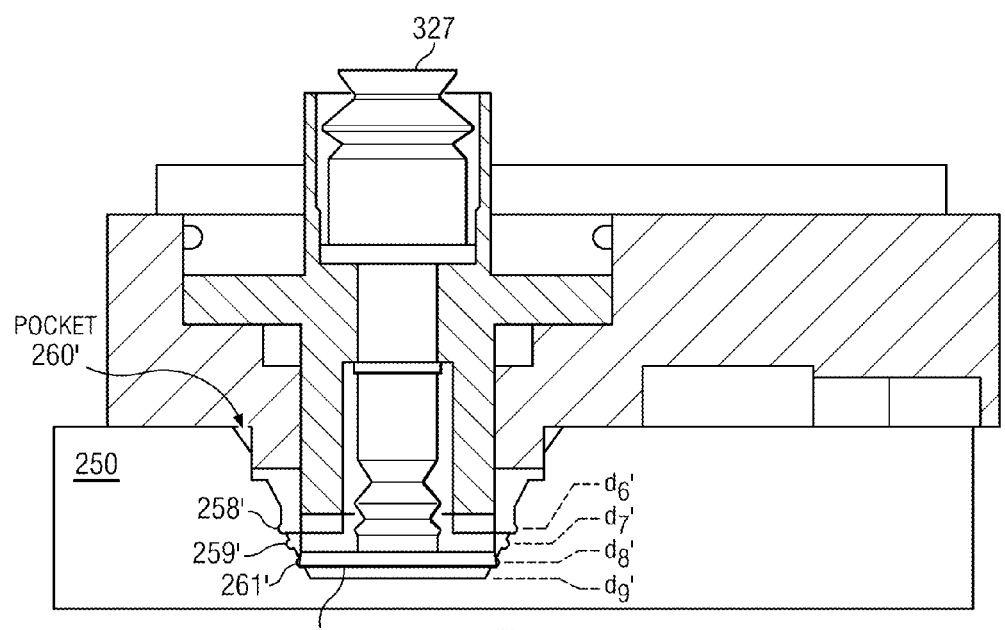

FIGS. 4A-F depict operation of disclosed pockets shown as pocket 260 described above for untested devices and pocket 260' for tested packaged devices which is a deeper variant of pocket 260 of a disclosed multi-package shuttle plate that functions as both as input shuttle for untested packaged devices and an output shuttle for tested devices interfacing with a TS PnP nest pieces 321 for three different packaged devices that have different package sizes. FIGS. 4A-C depict activity at shuttle pick up (before test) for the respective packaged devices and FIGS. 4D-F depict activity at shuttle drop (after test) for the respective packaged devices. As described above, the TS PnP nest units such as unit 321 together with the pockets of the shuttle plate sandwiches the packaged semiconductor devices.

FIG. 4A depicts a TS PnP nest unit 321 in position to pick up a packaged device 335 in pocket 260 of a disclosed multi-package shuttle plate prior to test. In one particular embodiment, the packaged device 335 shown in FIG. 4A having example dimensions 12.0 mm×12.0 mm is seated within a seating area having example dimensions of 12.3 mm×12.3 mm by the first notch 258 at a first pocket depth $d_6$. FIG. 4B depicts a TS PnP nest unit 324 in position to pick up a packaged device 345 of a disclosed multi-package shuttle plate prior to test. Packaged device 345 having example dimensions 11.0 mm×11.0 mm is seated within a seating area having example dimensions of 11.3 mm×11.3 mm by the second notch 259 at a first pocket depth $d_7$. FIG. 4C depicts a TS PnP nest unit 327 in position to pick up a packaged device 355 on pocket 260 of a disclosed multi-package shuttle plate prior test. Packaged device 355 having example dimensions 10.0 mm×10.0 mm is seated within a seating area having example dimensions of 10.3 mm×10.3 mm by the third notch 261 at a third pocket depth $d_8$. The depictions in FIGS. 4A-C thus demonstrate the same pocket 260 seating packaged device 335, packaged device 345, and packaged device 355, which all have different dimensions/sizes.

FIG. 4D shows the packaged device 335 shown in FIG. 4A at shuttle drop into pocket 260' after packaged device 335 is tested by a tester. As described above the pocket 260' used for tested packaged devices can be deeper as compared to pocket 260 for untested packaged devices, so that $d_6$, $d_7$, $d_8$ and $d_9$ shown for pocket 260 in FIGS. 4A-C are shown in FIGS. 4D-4F as $d_{6'}$, $d_{7'}$, $d_{8'}$ and $d_{9'}$, where $d_{6'} \geq d_6$, $d_{7'} \geq d_7$, $d_{8'} \geq d_8$ and $d_{9'} \geq d_9$. Notches 258, 259 and 261 in FIGS. 4A-C are shown as notches 258', 259' and 261' in FIGS. 4D-F. As shown in FIG. 4D, the packaged device 335 is seated on first notch 258' at a first pocket depth $d_{6'}$. FIG. 4E shows packaged device 345 (that is shown in FIG. 4B before test) at shuttle drop into pocket 260' being seated on the second notch 259' at a second pocket depth $d_{7'}$ after packaged device 345 is tested by a tester. FIG. 4F shows packaged device 355 (that is shown in FIG. 4C before test) at shuttle drop into pocket 260' being seated on the third notch 261' at a third pocket depth $d_{8'}$ after packaged device 355 is tested by a tester.

Thus, in the embodiment shown in FIGS. 4A-F, the pocket depth of pockets on the shuttle plate used for shuttle pick of untested devices as shown in FIGS. 4A-C is reduced as compared to the pocket depth of pockets on the shuttle plate used for shuttle drop of tested devices shown in FIGS. 4D-F. As described above, having a pocket depth during pick-up of untested packaged devices that is shallower helps allow the suction cups to engage enough on the packaged device surface to be able to reliably pick the packaged devices. A substantially deeper pocket depth for pockets on the shuttle plate used for shuttle drop of tested packaged devices allows sufficient clearance to disengage the packaged devices against the suction cups holding it. For example, in one particular embodiment the pocket depth for the pockets on the shuttle plate for placing tested packaged devices after test can be 0.6 to 1.2 mm deeper in one particular embodiment as compared to the pocket depth for pockets on the shuttle plate for placing untested devices.

Figure 5:
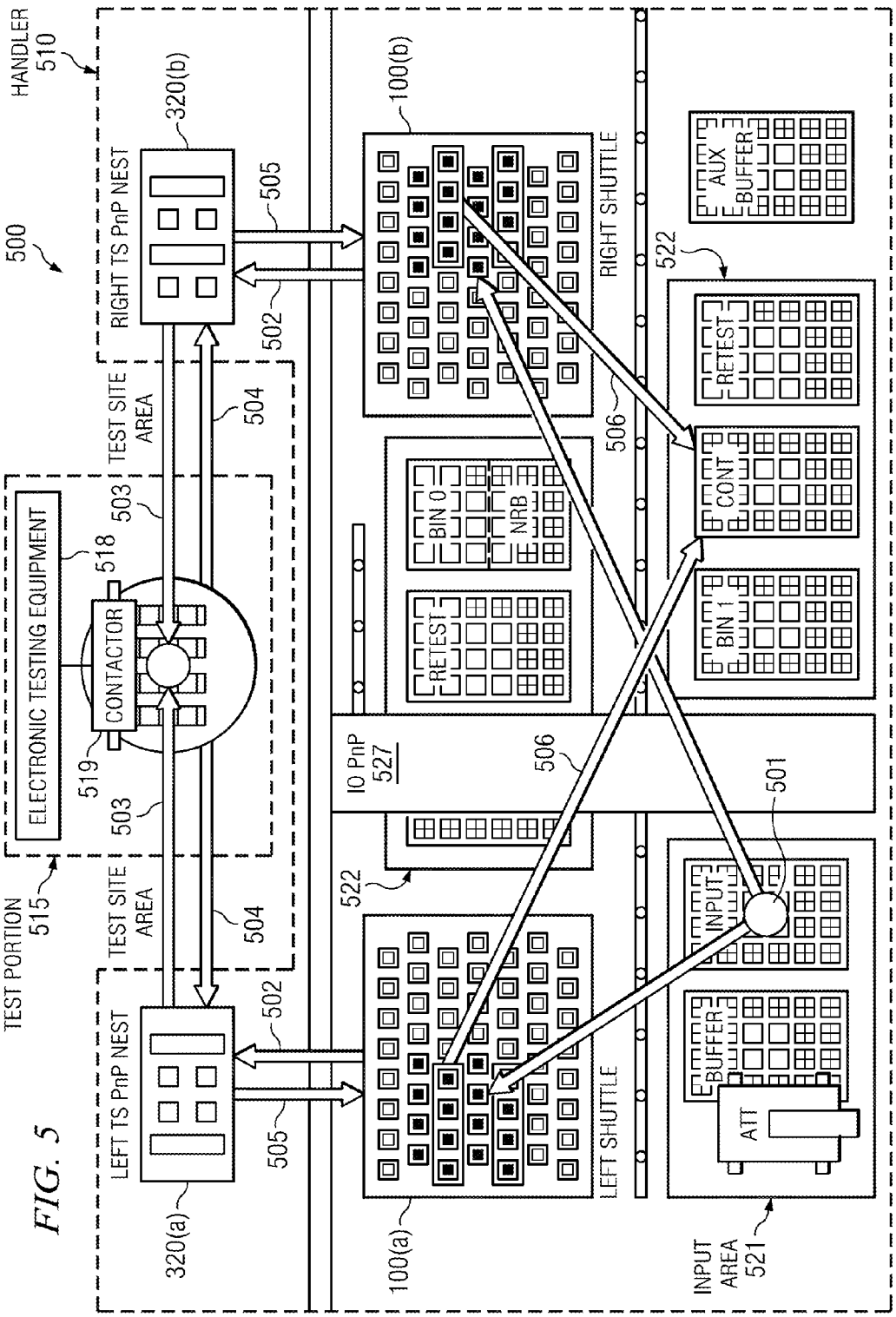
FIG. 5 is a simplified block depiction of an example electronic test system including a PnP test handler including a first and second disclosed multi-package shuttle plate, according to an example embodiment.

FIG. 5 is a simplified block depiction of an example electronic test system 500 including a disclosed PnP handler 510 including input and output multi-package shuttle plates that function as both as an input shuttle for untested devices and an output shuttle for tested devices shown as left (or first) multi-package shuttle plate 100(a) and right (or second) multi-package shuttle plates 100(b), respectively. The test portion 515 of system 510 comprises electronic testing equipment 518 and a contactor 519 that acts as an interface between the electronic testing equipment 518 and any packaged electronic devices in position for testing.

In operation, PnP handler 510 transports packages semiconductor devices from the input area 521 (e.g., where there are operator loaded units for test) to the test site area where electrical testing happens. Shuttle plates 100(a) and 100(b) can also act as a hot soak plate or a chilling soak plate to bring the packages devices to a required testing temperature before moving to the test site area. Sort tray area 522 includes sort trays, where tested packaged devices units are placed after testing based on their binning.

An example process flow based on example electronic test system 500 that is also depicted in FIG. 5 is now described. In 501, an IO PnP arm picks up packaged devices from the input area 521 and places the packaged devices on either the left multi-package shuttle plate 100(a) or right multi-package shuttle plate 100(b). These packaged devices can be heat soaked while on the shuttles plates for high temperature testing. In 502 the left multi-package shuttle plate 100(a) or right multi-package shuttle plates 100(b) moves to the test site area shown. Left TS PnP nest 320(a) picks up packaged devices from left multi-package shuttle plate 100(a) and the right TS PnP nest 320(b) picks packaged devices from the right multi-package shuttle plate 100(b).

In 503 the left TS PnP nest 320(a)/right TS PnP nest 320(b) then move to the contactor 519 to subject those packaged devices to electrical testing by electronic testing equipment 518. The TS PnP nests hold the packaged devices and ensures proper contact and alignment during testing. After testing, in 504 left TS PnP nest 320(a)/right TS PnP nest 320(b) moves the tested packaged devices away from the contactor 519, and in 505 the tested packaged devices are placed in left multi-package shuttle plate 100(a) and/or right multi-package shuttle plate 100(b) (placed in tested pockets). In 506 the tested packaged devices from left multi-package shuttle plate 100(a) and/or right multi-package shuttle plate 100(b) are picked by IO PnP 527 which places them in sort trays in sort tray area 522 based on the binning determination at test.

An example method for testing semiconductor devices includes first electrical testing at least one first packaged semiconductor device having a first package size including transporting the first packaged semiconductor device using a test handler including an input and an output multi-package shuttle plate fit on the test handler from an input area (where operator loaded units for test) using the input multi-package shuttle plate to a test site area including a first contactor where first electrical testing occurs, and from the test site using the input multi-package shuttle plate to sorted trays in an output area.

Upon presentation of a test lot including packaged semiconductor devices having a different size, the test handler hardware is modified (and generally some software parameters are entered) for testing at least one second packaged semiconductor device having a second package size. The modifying includes replacing the first contactor with a second contactor. The TS PnP nest and IO PnP suction cups are also replaced. The modifying does not include replacing or laterally moving the input or output multi-package shuttle plates (e.g., moving to reposition to utilize different sized pockets). Some software parameters may also be modified. For example, the set-up temperature setpoint (e.g., from 25° C. to 130° C.), binning assignments (e.g., to what platform or tray should the devices be sorted after test depending on the test result), conversion kit parameters (e.g., tray and shuttle matrix for correct device placement so that the packaged devices are centered on the pockets, and test site contact pressure. Following the handler modification, electrical testing is performed on at least one second packaged semiconductor device including transporting the second packaged semiconductor using the input multi-package shuttle plate from the input area to the test site area where the second electrical testing occurs, and from the test site using the output multi-package shuttle plate to sorted trays in the output area.

In an example pocket design, a selected package size is considered standard. In the combination of device package sizes, a general rule that can be followed is that the largest device package size in the combination of device package sizes of a kit will be the standard, reference point (or the baseline). For example, for a multi-package pocket that combines 12×12 mm, 11×11 mm and 10×10 mm packaged device sizes, 12×12 mm can be considered to be the standard because 12×12 mm is the largest package in the package combination, making the biggest package the standard (12×12 mm for this example) allows not changing the pocket depth as compared with the conventional shuttle plates which makes the TS PnP nest the same as the conventional TS PnP nest, and shuttle plate pockets can only be designed to get deeper and not to get shallower, due a typical shuttle plate thickness restriction.

To modify the setup beginning with a 12×12 mm baseline to allow for 11×11 mm or 10×10 mm, can include using a disclosed multi-package shuttle plates including pockets such as pocket 260 including a top notch (or shoulder cut) in the sidewall of the pocket for 12×12 mm a packaged device, another notch below the top notch in the sidewall for 11×11 mm devices, and another notch near the bottom of the pocket for 10×10 mm packages. Moreover, the contactor fixed plate (the part of the contactor that controls the X/Y movement of TS PnP nest) thickness may be modified to account for a possible change in device thickness.

Although the examples above generally refer multi-package shuttle plates including pockets that seat a 12×12 mm (primary packaged device), 11×11 mm (secondary packages device) and 10×10 mm (tertiary package device), disclosed multi-package shuttle plates can be designed for a variety of other combination of package sizes that has a plurality of package sizes, such as (e.g. 23×23 mm, 22×22 mm, 21×21 mm or 18×18 mm, 13×13 mm, 7×7 mm, etc), or more than three package sizes, such as four or five different package sizes.

Disclosed embodiment will be helpful for automated test facilities due to the significantly reduced conversion downtime as well as lower acquisition cost due to less needed shuttle plate hardware. The disclosed multi-package size aspect of disclosed embodiments will reduce both the cost of buying different sets of hardware as well on the downtime being incurred in changing of such hardware during conversion, such as a reduction of about 1 hour in conversion time, resulting in a productivity improvement.

Disclosed embodiments can be integrated into a variety of test flows to test a variety of different IC devices and related products. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. An input/output shuttle plate, comprising:
a metal plate having a plurality of pockets, wherein said plurality of pockets have a bottom, a sidewall portion and a pocket depth, wherein said pocket depth is measured from said top surface of said plate toward said bottom;
a first seating surface at a first pocket depth for supporting a first packaged semiconductor device having a first package size; and
at least a second seating surface at a second pocket depth for supporting a second packaged semiconductor device having a second package size;
wherein said first pocket depth is less than said second pocket depth;
wherein said first package size is larger than and said second package size, and
wherein said shuttle plate is adapted to be fit on a test handler.

2. The shuttle plate of claim 1, wherein said first seating surface comprises a first notch in said sidewall portion at said first pocket depth and said second seating surface comprises a second notch in said sidewall portion at said second pocket depth.

3. The shuttle plate of claim 1, wherein said sidewall portion comprises a sloped sidewall.

4. The shuttle plate of claim 1, further comprising shuttle plate clips for attaching said shuttle plate to said test handler.

5. The shuttle plate of claim 1, wherein said plurality of pockets share the same pocket design for seating both said first packaged semiconductor device and said second packaged semiconductor device.

6. The shuttle plate of claim 1, wherein said plurality of pockets further comprise a third seating surface at a third pocket depth for supporting a third packaged semiconductor device having a third package size, wherein said second package size is larger than said third package size.

7. The shuttle plate of claim 1, wherein a portion of said plurality of pockets provide said first pocket depth for supporting said first packaged semiconductor device and said second pocket depth for supporting said second packaged semiconductor device, and another portion of said plurality of pockets that provide a third pocket depth that is substantially deeper as compared to said first pocket depth for supporting said first packaged semiconductor device and a fourth pocket depth that is substantially deeper as compared to said second pocket depth for supporting said second packaged semiconductor device, wherein said shuttle plate can function as both as input shuttle for untested ones of said first and second packaged semiconductor devices and an output shuttle for tested ones of said first and second packaged semiconductor devices.

8. A changeover kit for package-to-package conversion of a test handler, comprising:
   a plurality of pick and place (PnP) suction cups;
   at least one input/output shuttle plate, comprising:
      a metal plate having a plurality of pockets, wherein said plurality of pockets have a bottom, a sidewall portion and a pocket depth, wherein said pocket depth is measured from said top surface of said plate toward said bottom;
      a first seating surface at a first pocket depth for supporting a first packaged semiconductor device having a first package size; and
      at least a second seating surface at a second pocket depth for supporting a second packaged semiconductor device having a second package size;
      wherein said first pocket depth is less than said second pocket depth;
      wherein said first package size is larger than and said second package size, and
      wherein said shuttle plate is adapted to be fit on a test handler, and
   a multi-piece test site (TS) PnP nest for receiving at least one of said plurality of pick and place (PnP) suction cups.

9. The kit of claim 8, wherein said first seating surface comprises a first notch in said sidewall portion at said first pocket depth and said second seating surface comprises a second notch in said sidewall portion at said second pocket depth.

10. The kit of claim 8, wherein said sidewall portion comprises a sloped sidewall.

11. The kit of claim 8, further comprising shuttle plate clips for attaching said shuttle plate to said test handler.

12. The kit of claim 8, wherein said plurality of pockets share the same pocket design for seating both said first packaged semiconductor device and said second packaged semiconductor device.

13. The kit of claim 8, wherein a portion of said plurality of pockets provide said first pocket depth for supporting said first packaged semiconductor device and said second pocket depth for supporting said second packaged semiconductor device, and another portion of said plurality of pockets are deeper pockets that provide a third pocket depth that is substantially deeper as compared to said first pocket depth for supporting said first packaged semiconductor device and a fourth pocket depth that is substantially deeper as compared to said second pocket depth for supporting said second packaged semiconductor device, wherein said shuttle plate can function as both as input shuttle for untested ones of said first and second packaged semiconductor devices and an output shuttle for tested ones of said first and second packaged semiconductor devices.

14. The kit of claim 8, wherein said plurality of pockets further comprise further comprise a third seating surface at a third pocket depth for supporting a third packaged semiconductor device having a third package size, wherein said second package size is larger than said third package size.

15. A method for testing semiconductor devices, comprising:
   first electrical testing at least one first packaged semiconductor device having a first package size including transporting said first packaged semiconductor device using a test handler including a first and a second multi-package shuttle plate that each include a plurality of pockets fit on said test handler from an input area to a test site area including a first contactor where said first electrical testing occurs, and from said test site to sorted trays in an output area,
   modifying said test handler for testing at least one second packaged semiconductor device having a second package size including replacing said first contactor with a second contactor, wherein said modifying does not include replacing or laterally moving said first or said second multi-package shuttle plates, and
   second electrical testing at least said second packaged semiconductor device including transporting said second packaged semiconductor using said first and second multi-package shuttle plate from said input area to said test site area where said second electrical testing occurs, and from said test site to said sorted trays in said output area.

16. The method claim 15, wherein said plurality of pockets include a first seating surface comprising a first notch in a sidewall portion at a first pocket depth and a second seating surface that comprises a second notch in said sidewall portion at a second pocket depth.

17. The method of claim 16, wherein said sidewall portion comprises a sloped sidewall.

18. The method of claim 15, wherein said plurality of pockets share the same pocket design for seating both said first packaged semiconductor device and said second packaged semiconductor device.

19. The method of claim 15, wherein said first and said second multi-package shuttle plate are utilized as both an input shuttle for untested ones of said first and said second packaged semiconductor devices, and an output shuttle for tested ones of said first and said second packaged semiconductor devices.

20. The method of claim 19, wherein said first and said second multi-package shuttle plates each include a portion of said plurality of pockets providing a first pocket depth for supporting said first packaged semiconductor device and a second pocket depth for supporting said second packaged semiconductor device, and another portion of said plurality of pockets are deeper pockets that provide a third pocket depth that is substantially deeper as compared to said first pocket depth for supporting said first packaged semiconductor device and a fourth pocket depth that is substantially deeper as compared to said second pocket depth for supporting said second packaged semiconductor device.

21. An electronic test system, comprising:
   a pick and place (PnP) test handler including first and second multi-package shuttle plates and at least one test site (TS) PnP nest configured for transporting packaged semiconductor devices from an input area to a test site area for testing and from said test site area to output area after said testing, wherein said first and said second multi-package shuttle plates comprise:
      a metal plate having a plurality of pockets, wherein said plurality of pockets have a bottom, a sidewall portion and a pocket depth, wherein said pocket depth is measured from said top surface of said plate toward said bottom;
      a first seating surface at a first pocket depth for supporting a first packaged semiconductor device having a first package size, and
      at least a second seating surface at a second pocket depth for supporting a second packaged semiconductor device having a second package size,
      wherein said first pocket depth is less than said second pocket depth, wherein said first package size is larger than and said second package size, and wherein said shuttle plates are fit on said test handler, and electronic testing equipment and at least one contactor in said test site area, said contactor acting as an interface between said electronic testing equipment and said packaged semiconductor devices for testing said packaged semiconductor devices when said packaged electronic devices are inserted into said contactor.

22. The test system of claim 21, wherein said first seating surface comprises a first notch in said sidewall portion at said first pocket depth and said second seating surface comprises a second notch in said sidewall portion at said second pocket depth.

23. The test system of claim 21, wherein said sidewall portion comprises a sloped sidewall.

24. The test system of claim 21, wherein said plurality of pockets share the same pocket design for seating both said first packaged semiconductor device and said second packaged semiconductor device.

25. The test system of claim 21, wherein said plurality of pockets further comprise a third seating surface at a third pocket depth for supporting a third packaged semiconductor device having a third package size, wherein said second package size is larger than said third package size.

* * * * *